(12) United States Patent
Seow et al.

(10) Patent No.: US 12,549,190 B2
(45) Date of Patent: Feb. 10, 2026

(54) TRACK-AND-HOLD CIRCUIT HAVING PRE-CHARGING MOSFET CAPACITOR THEREOF FOR SHORTENING WAKE-UP DELAY TIME

(71) Applicant: PixArt Imaging Incorporation, Hsinchu (TW)

(72) Inventors: Boon-Eu Seow, Penang (MY); Kei-Tee Tiew, Penang (MY)

(73) Assignee: PixArt Imaging Incorporation, Hsinchu (TW)

( * ) Notice: Subject to any disclaimer, the term of this patent is extended or adjusted under 35 U.S.C. 154(b) by 91 days.

(21) Appl. No.: 18/671,042

(22) Filed: May 22, 2024

(65) Prior Publication Data

US 2025/0365001 A1 Nov. 27, 2025

(51) Int. Cl.
  H03M 1/12 (2006.01)
  H02M 3/07 (2006.01)
  H03M 1/38 (2006.01)

(52) U.S. Cl.
  CPC ......... *H03M 1/1245* (2013.01); *H02M 3/073* (2013.01); *H03M 1/38* (2013.01)

(58) Field of Classification Search
  CPC ....... H03M 1/1245; H03M 1/38; H02M 3/073

USPC ................................. 341/122, 123, 161, 163
See application file for complete search history.

(56) References Cited

U.S. PATENT DOCUMENTS

| | | | |
|---|---|---|---|
| 7,183,814 B2 * | 2/2007 | Kudo | H03K 17/063 |
| | | | 327/91 |
| 10,720,911 B2 * | 7/2020 | Shin | H02M 3/073 |

* cited by examiner

*Primary Examiner* — Khai M Nguyen
(74) *Attorney, Agent, or Firm* — Tung & Associates

(57) ABSTRACT

A track-and-hold circuit includes a charge pump circuit and a bootstrapped switch. The charge pump circuit pumps a supply voltage into a pumped voltage higher than the supply voltage, including: a MOSFET capacitor, switched based on a clock signal; and a pre-charging circuit for pre-charging a body of the MOSFET capacitor based on a pre-charging signal synchronous with the clock signal, thereby reducing a wake-up delay time of the pumped voltage. The bootstrapped switch tracks and holds an input signal received from one end based on a bootstrapped driving signal, thereby generating a track-and-hold output signal on another end. The bootstrapped driving signal is generated based on a track-and-hold control signal related to the clock signal, the input signal and the pumped voltage provided by the charge pump circuit.

10 Claims, 9 Drawing Sheets

TRACK-AND-HOLD CIRCUIT HAVING PRE-CHARGING MOSFET CAPACITOR THEREOF FOR SHORTENING WAKE-UP DELAY TIME

BACKGROUND OF THE INVENTION

Field of Invention

The present invention relates to a track-and-hold circuit; particularly it relates to a track-and-hold circuit having pre-charging its MOSFET capacitor for shortening wake-up delay time. The present invention also relates to a track-and-hold circuit for use in data converters such as SAR ADC.

Description of Related Art

Track-and-hold circuit is one of the important blocks in low voltage successive approximation register analog-to-digital converter (SAR ADC) design, by stabilizing the input signal prior to digitization, enhancing the accuracy and efficiency of the conversion process. FIG. 1 shows a schematic diagram of a prior art track-and-hold circuit. The track-and-hold circuit 101 includes a charge pump circuit 110, a bootstrap driving circuit 120, and a bootstrapped switch M11. The charge pump circuit 110 operates by utilizing capacitors C1 and C2 along with switches M1 and M2 according to a clock signal for the charge pumping operation. Capacitor C3 is used to generate the driving voltage and switching signal required for the bootstrap switch operation.

These capacitors are usually implemented using MIM (metal-insulator-metal), MOM (metal-oxide-metal) capacitors or N-Polycap (N-poly type of capacitor) capacitors. The layout area occupied by these types of the capacitors s is the main disadvantage, which tremendously increases the total size of the SAR ADC, especially in the multichannel SAR ADC. Besides that, utilizing the N-Polycap in the track-and-hold circuit also causes extra wafer process cost.

Therefore, the MOSFET capacitors (e.g., PMOSFET) are then a preferred choice to reduce the layout area and the process cost. The disadvantage of using the MOSFET capacitors in the track-and-hold circuit is the "wake-up delay time" issue caused by the parasitic n-well diodes, formed by the n-well and p-substrate junctions, of the MOSFET capacitors.

Still referring to FIG. 1, the unwanted parasitic n-well diodes (e.g., DP1-DP3) appeared at the nodes N1, N2 and N3. These parasitic diodes have significant impact on the charging time of the capacitors at the nodes N1 and N2 of the cross-coupled clock booster (i.e., the charge pump 110), which consequently increases the wake-up delay time of the track-and-hold circuit. The parasitic n-well diodes of the MOS capacitors discharge the voltage at N1 and N2 to near ground voltage level before start-up, it therefore requires extra charging time when the clock toggles from logic "low" to logic "high", during startup, to re-charge the capacitors at N1 and N2 in the cross-coupled pair.

FIG. 2 shows the simulation results of the wake-up delay time of the prior art track-and-hold circuit with MOS Capacitors. In worst-case process corner, the wake-up delay time may be, unacceptably, up to 608 us.

To address the above issue, the track-and-hold circuit of the present invention circuit aims to mitigate the wake-up delay time while maintaining the all-CMOS circuit (i.e., using MOSFET capacitors), thereby reducing the chip layout area and the fabrication cost.

SUMMARY OF THE INVENTION

From one perspective, the present invention provides a track-and-hold circuit comprising: a charge pump circuit configured to pump a supply voltage into a pumped voltage which is higher than the supply voltage, including: a metal-oxide-semiconductor field-effect transistor (MOSFET) capacitor (MOSFET cap), switched based on a clock signal; and a pre-charging circuit, configured to pre-charge a body of the MOSFET cap based on a pre-charging signal synchronous with the clock signal, thereby reducing a wake-up delay time of the pumped voltage; and a bootstrapped switch, configured to track and hold an input signal received from one end of the bootstrapped switch based on a bootstrapped driving signal, thereby generating a track-and-hold output signal on another end of the bootstrapped switch; wherein the bootstrapped driving signal is generated based on a track-and-hold control signal related to the clock signal, the input signal and the pumped voltage provided by the charge pump circuit.

In one embodiment, the track-and-hold circuit of claim 1, wherein the pre-charging circuit includes: a pre-charging switch, coupled between a pull-up source and the body of the MOSFET cap, wherein the pre-charging switch is switched based on the clock signal to generate the pre-charging signal which pulls up a body bias voltage of the body of the MOSFET cap to the pull-up source.

In one embodiment, the supply voltage serves as the pull-up source.

In one embodiment, the pre-charging switch is controlled to switch in synchronization with a specific phase, of the clock signal, during which a baseline voltage of the voltage across the MOSFET cap is to be is to be pull-down to logic low by the clock signal for charging the MOSFET cap.

In one embodiment, the pre-charging circuit further comprises: a clamping transistor, coupled between the body of the MOSFET capacitor and the pre-charging switch, configured to protect the pre-charging switch from high voltage stress originating from the body of the MOSFET capacitor; wherein the clamping transistor is configured as a source follower, biased by a predetermined voltage to clamp a voltage of the pre-charging switch not exceeding a predetermined upper limit.

In one embodiment, the charge pump circuit is configured as a voltage doubler, wherein the at least one MOSFET cap includes a first and a second MOSFET capacitors, each configured to store charge and to be pumped to a higher voltage related to the pumped voltage, wherein the charge pump circuit further includes: a first switch and a second switch which are cross-coupled, wherein the first and the second switches are coupled to the first and second MOSFET capacitors respectively at respective source terminal thereof, and gates the first and the second switches are cross-coupled to the second and the first MOSFET capacitors respectively; wherein the first MOSFET capacitor is switched by the clock signal and the second MOSFET capacitor is switched by an inverse of the clock signal, facilitating alternate charging and pumping cycles between the first and second MOSFET capacitors; wherein the pre-charging circuit is configured to pre-charge at least one of the first and second MOSFET capacitors.

In one embodiment, the track-and-hold circuit further comprises a third switch and a third MOSFET capacitor which are coupled to the second capacitor and are configured to generate and holding the pumped voltage, wherein the pre-charging circuit is configured to pre-charge the first MOSFET capacitor, thereby balancing the capacitive loading between the first and the second MOSFET capacitors while providing the pumped voltage.

In one embodiment, the MOSFET cap is implemented by a same type MOSFET device, formed in same process steps, of at least one switch within the charge pump circuit.

In one embodiment, the pre-charging circuit pre-charges the body of the MOSFET cap during startup of the charge pump circuit, and is disabled when the pumped voltage is high enough or when a predetermined startup time has expired.

In one embodiment, the track-and-hold circuit is for use in a successive approximation register analog-to-digital converter (SAR ADC), wherein the SAR ADC includes a comparator, a SAR logic circuit and a digital-to-analog converter (DAC), wherein the track-and-hold circuit is configured to track and hold the input signal to generate the track-and-hold output signal, wherein the comparator, the SAR logic circuit and the DAC are configured to convert the track-and-hold output signal by successive approximation register conversion to generate a corresponding digital code.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
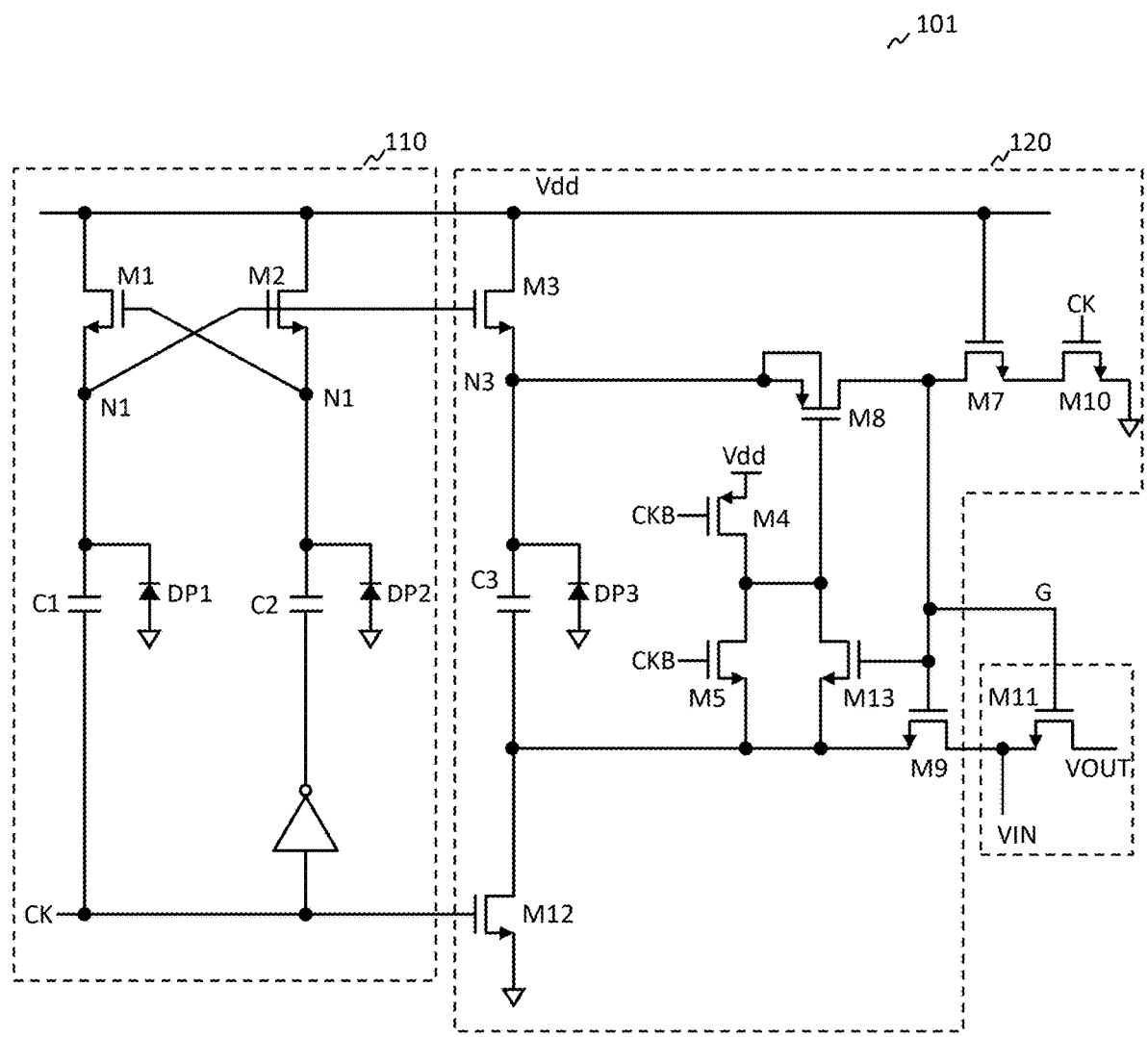
FIG. 1 shows a schematic diagram of a prior art track-and-hold circuit.
Figure 2:
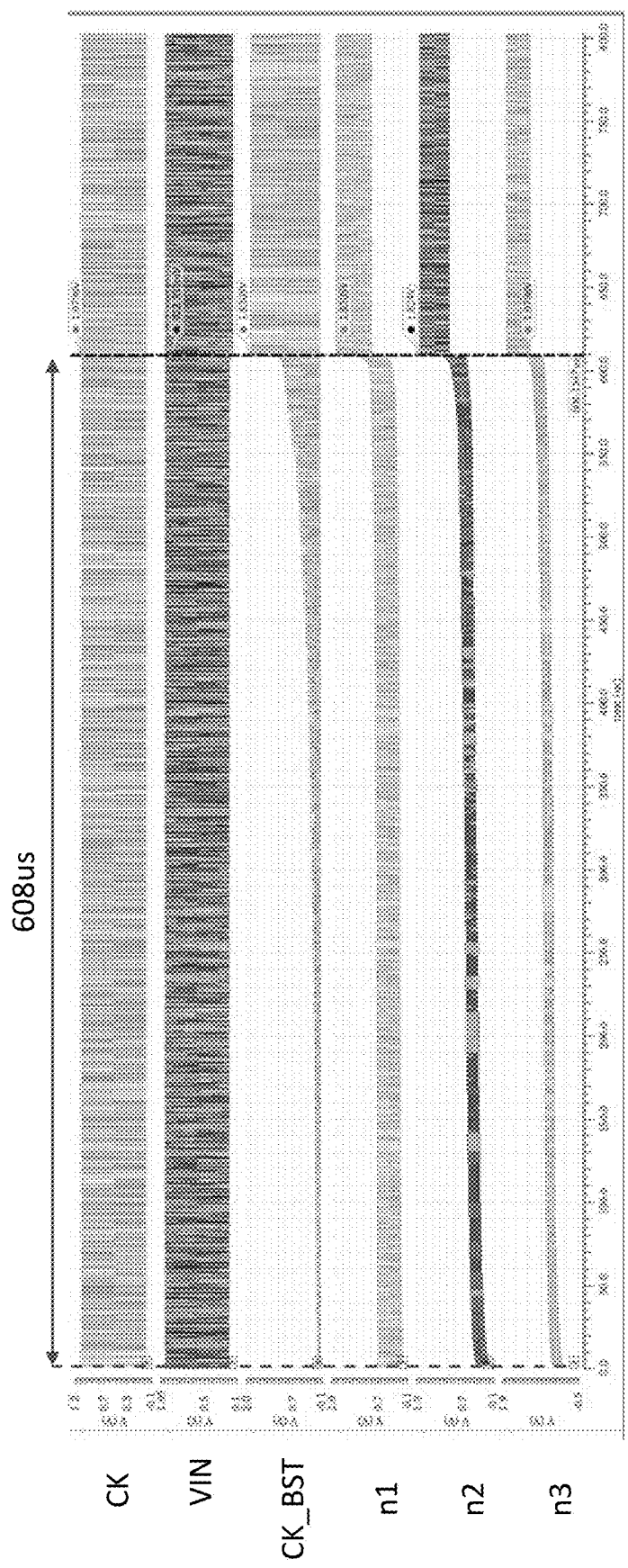
FIG. 2 shows a simulation waveform diagram of a prior art track-and-hold circuit.
Figure 3:
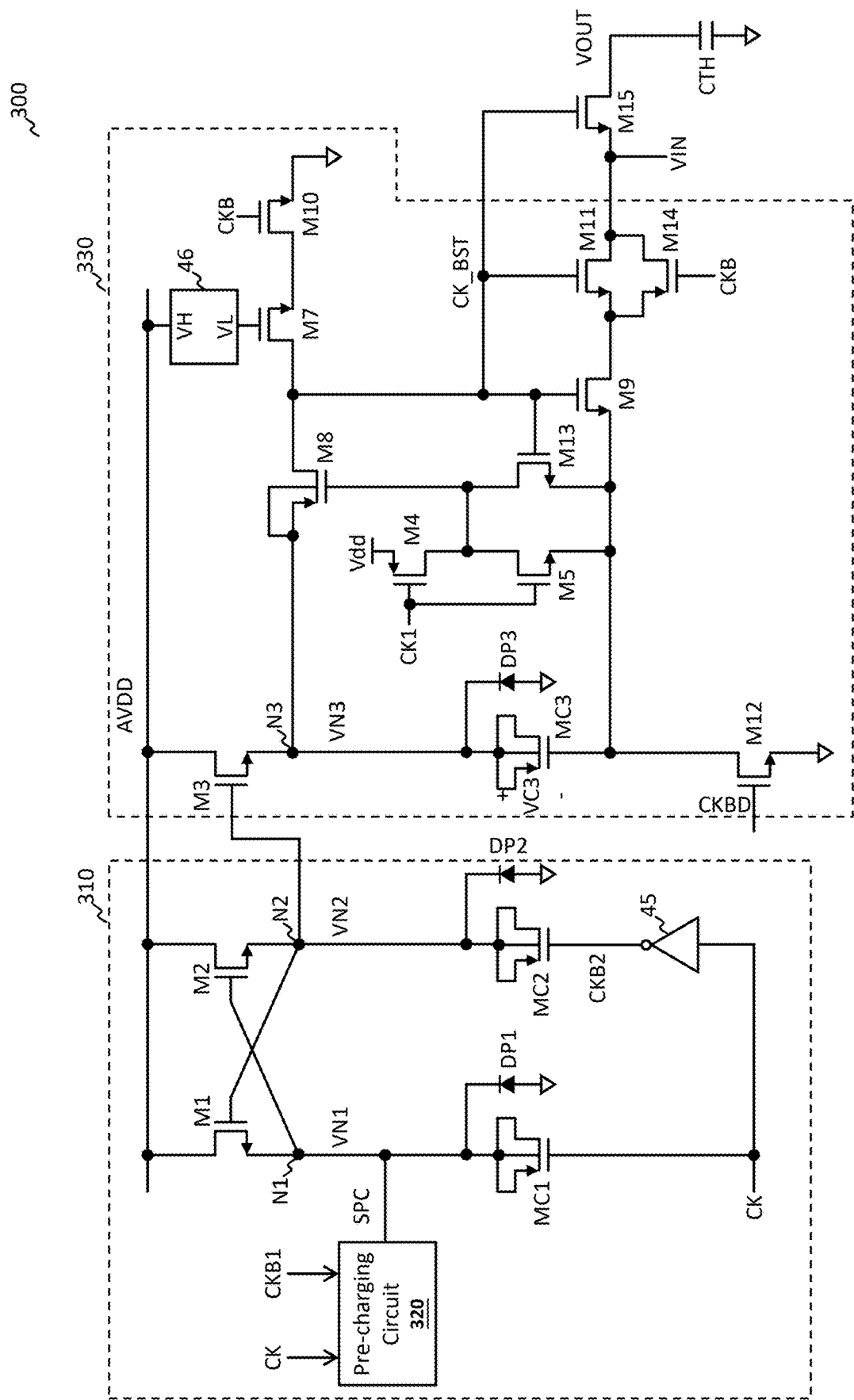
FIG. 3 shows a schematic diagram of an embodiment of a track-and-hold circuit according to the present invention.

FIG. 3 shows a schematic diagram of an embodiment of a track-and-hold circuit according to the present invention. The track-and-hold circuit 300 comprises a charge pump circuit 310, a bootstrap driving circuit 330 and a bootstrapped switch M15.

The charge pump circuit 310 is configured to pump a supply voltage AVDD into a pumped voltage which is higher than the supply voltage AVDD.

In one embodiment, the charge pump circuit 310 includes at least one metal-oxide-semiconductor field-effect transistor capacitor (MOSFET cap) and a pre-charging circuit 320. The MOSFET cap is switched by plural switches within the charge pump circuit based on a clock signal CK for pumping the supply voltage AVDD into the pumped voltage. The pre-charging circuit 320 is configured to pre-charge a body of the MOSFET cap based on a pre-charging signal SPC synchronous with the clock signal CK, thereby reducing a wake-up delay time of the pumped voltage.

The bootstrap driving circuit 330 is configured to generate a bootstrapped driving signal CK_BST, based on a track-and-hold control signal CK1, the input signal VIN and the pumped voltage provided by the charge pump circuit 310, to drive the bootstrapped switch M15. The bootstrapped switch M15 is configured to track and hold an analog input signal VIN received from one end of the bootstrapped switch M15 based on the bootstrapped driving signal CK_BST, thereby generating a track-and-hold output signal VOUT on another end of the bootstrapped switch M15. A holding capacitor CTH is configured to hold the track-and-hold output signal VOUT.

Still referring to FIG. 3, in one embodiment, the charge pump circuit 310 includes a voltage doubler. The aforementioned at least one MOSFET cap of the voltage doubler include, in this embodiment, a first and second MOSFET cap capacitors MC1 and MC2, each configured to store charge and to be pumped to a higher voltage related to the pumped voltage. The voltage doubler 310 further includes a pair of cross-coupled switches M1 and M2, each switch coupling to a corresponding one of the first and second MOSFET cap MC1 and MC2 at its source terminal. Gates of the switches M1 and M2 are cross-coupled to the second and the first MOSFET cap MC2 and MC1 respectively.

In this embodiment, the first MOSFET cap MC1 is switched by a clock signal CK and the second MOSFET cap MC2 is switched by an inverse clock signal CKB2 of the clock signal CK, facilitating alternate charging and pumping cycles between the two MOSFET capacitors.

The pre-charging circuit 320 is configured to pre-charge at least one of the MOSFET cap (e.g. MC1), reducing the wake-up delay time and thereby accelerating the voltage doubling effect. More specifically, during operation, when the first MOSFET cap MC1 is charged during one phase (e.g., logic low) of the clock signal CK, the second MOSFET cap MC2 is pumped up, contributing its stored charge to a higher voltage, and vice versa, effectively doubling the output voltage relative to the supply voltage AVDD, provided the amplitude of the clock signals are also the same level of the supply voltage AVDD. During steady state, when the second MOSFET cap MC2 is pumped up (i.e., when CKB1 is high), the switches M1 and M3 are turned ON by the pumped voltage VN2, thereby charging the MOSFET cap MC1 through the switch M1 and charging the MOSFET cap MC3 through the switch M3.

Note that the aforementioned "pumped voltage" can be referred to as the voltages VN1, VN2 or VN3 on the nodes N1, N2 and N3 respectively, or can be referred to as the voltage across the MOSFET cap MC3, VC3.

Figure 4:
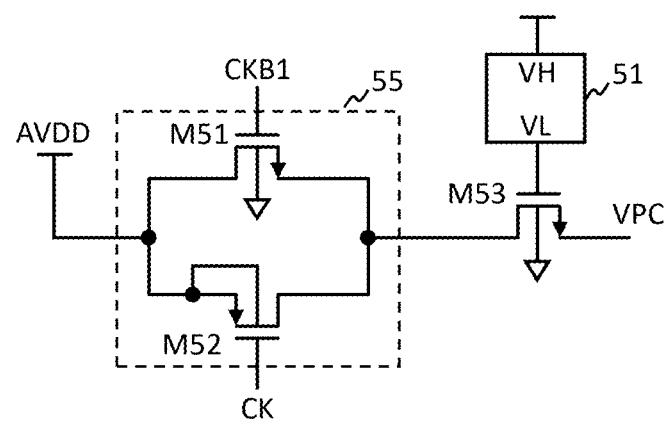
FIG. 4 shows a schematic diagram of an embodiment of a pre-charging circuit of a track-and-hold circuit according to the present invention.

The wake-up delay time can be drastically improved by introducing the pre-charging circuit 320 to the all-CMOS charge pump circuit 310. Please still refer to FIG. 3, in conjunction with FIG. 4 showing a schematic diagram of an embodiment of a pre-charging circuit of a track-and-hold circuit according to the present invention and FIG. 8 which illustrates a simulation waveform diagram of an embodiment of a track-and-hold circuit according to the present invention. The newly proposed pre-charging circuit includes a transmission gate 55 formed by pre-charging switches M51 and M52 and an always-on (tie-to-high) NMOS switch M53. The transmission gate 55 is controlled by CK and CKB1. When CK is at logic low, the transmission gate 55 turns on and electrically connects a pull-up source to node N1, so that the voltage VN1 at the node N1 can maintain the charge level, thereby reducing the charging time at node N1 and significantly shorten the wake-up delay time. When CK is at logic high, the transmission gate 55 is off, it then electrically disconnects the pull-up source from the node N1. In one embodiment, the pull-up source can be the supply voltage AVDD.

Note that, in the embodiment as shown in FIG. 3, the sub-pumping circuit formed by the switch M3 and the MOSFET cap MC3 are coupled to the MOSFET cap MC2 at the node N2, while the pre-charging circuit 320 is configured to pre-charge the MOSFET cap MC1 at the node N1, thereby balancing the capacitive loading between the MOSFET capacitors MC1 and MC2 while providing the pumped voltage during the pumping operation.

In addition to the voltage doubler described above, the charge pump can be alternatively implemented with other types of switched-capacitor charge pump circuitries. The pre-charging operation at the pumping capacitors are also applicable for other charge pump topologies.

Figure 6:
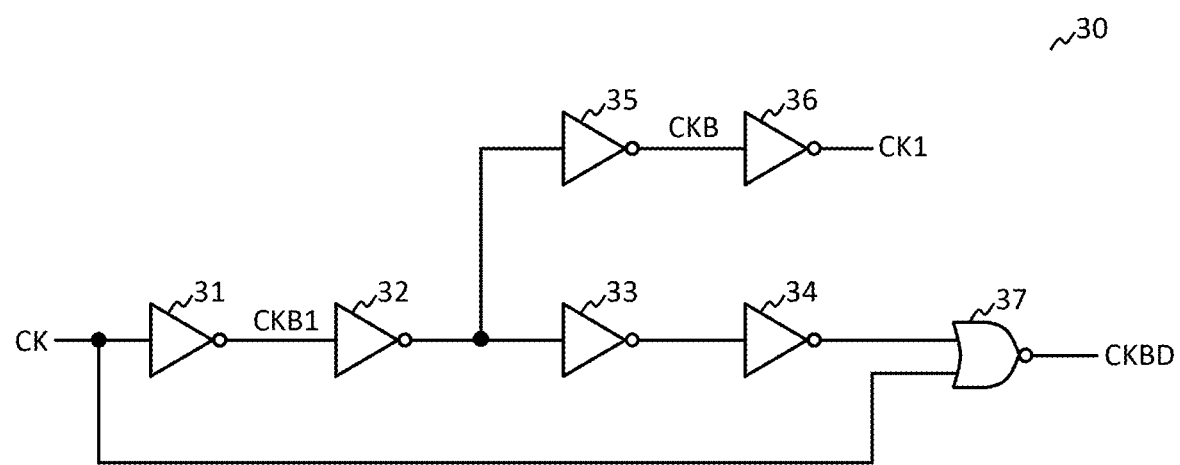
FIG. 6 shows a schematic diagram of an embodiment of a clock generator circuit of a track-and-hold circuit according to the present invention.
Figure 7:
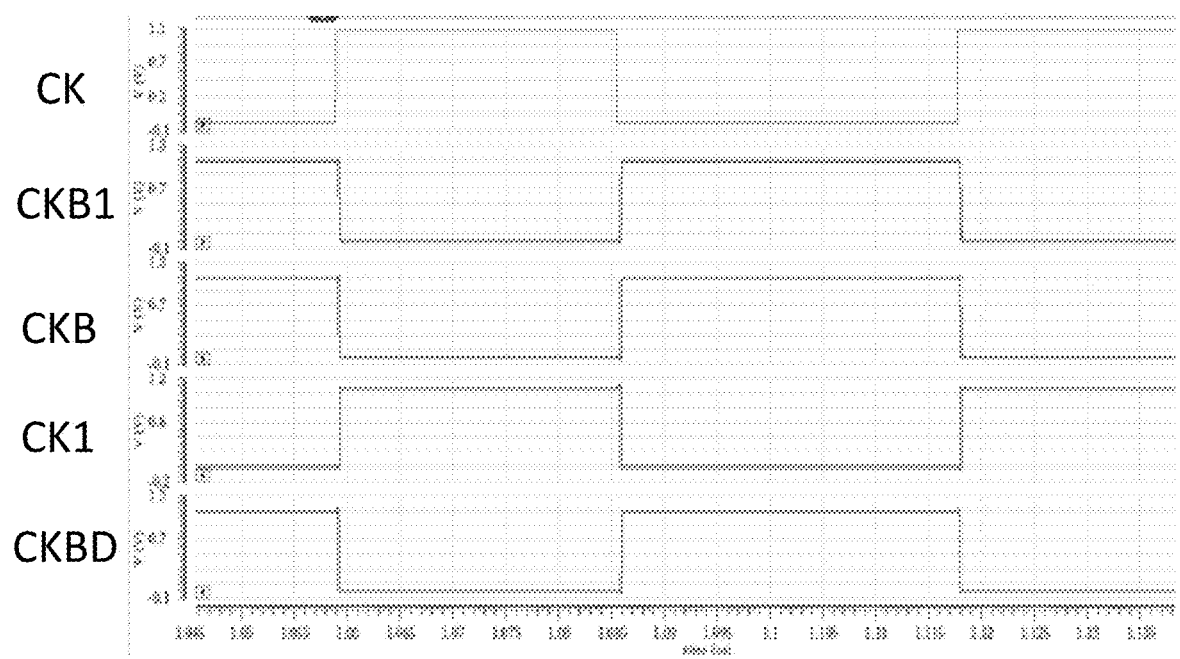
FIG. 7 shows a simulation waveform diagram of an embodiment of a clock generator circuit of a track-and-hold circuit according to the present invention.

FIG. 6 shows a schematic diagram of an embodiment of a clock generator circuit of a track-and-hold circuit according to the present invention. FIG. 7 shows a simulation waveform diagram of an embodiment of a clock generator circuit of a track-and-hold circuit according to the present invention. In one embodiment, as shown in FIG. 6 and FIG. 7, the clock generator circuit is configured to generate related clock signals having different phases or driving capabilities. The clock generator circuit 30 is configured to generate a track-and-hold control signal CK1 which is a buffered in-phase version of the clock signal CK. The clock signals CKB, CKB2 (shown in FIG. 3) are two other inverse version of the clock signal CK. The clock signal CKBD is a non-overlapped inverse version of the clock signal CK.

Still referring to FIG. 4, in one embodiment, the transmission gate 55 is controlled to be ON in synchronization with a specific phase, of the clock signal CK, during which a baseline voltage (e.g., the negative terminal voltage of MC1) of the voltage across the MOSFET cap MC1 is to be pull-down to logic low by the clock signal CK for charging the MOSFET cap MC1. In one embodiment, the pre-charging stops, by turning off the transmission gate 55, when the baseline voltage of the voltage across the MOSFET cap MC1 is elevated to pump the node voltage VN1.

Still referring to FIG. 4, the always-on NMOS switch 53 is to provide isolation between the output of the transmission gate 55 and the node N1. More specifically, the always-on NMOS switch 53 absorbs the injection charge from the transmission gate 55 when the transmission gate turns off and isolates the transmission gate 55 from node N2 so that the transmission gate 55 does not experience high voltage from the node N2. Note that the high voltage from the node N2 can be higher than an upper limit and damage the transistors M51 and M52 of the transmission gate 55.

Figure 5:
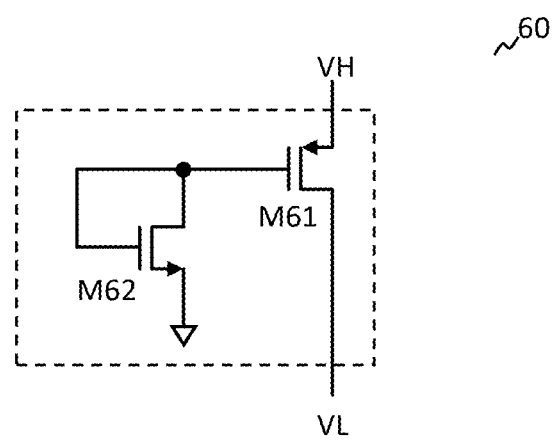
FIG. 5 shows a schematic diagram of an embodiment of a pull-up circuit of a track-and-hold circuit according to the present invention.

Still referring to FIG. 4, from one perspective, the always-on NMOS switch 53 is configured as a clamping transistor, biased by a predetermined voltage to maintain a voltage of the pre-charging switch M21 not exceeding a predetermined upper limit. The predetermined voltage can be provided for example by a pull-up circuit as shown in FIG. 5. In one embodiment, the pull-up circuit 60 includes a PMOS switch M61, which is coupled between terminals VH and VL, and is controlled by a diode connected NMOS transistor M62. Note that the pull-up circuit 60 can also be employed for pulling up the voltage of a switch M7 within the bootstrap driving circuit 330 shown in FIG. 3.

Figure 8:
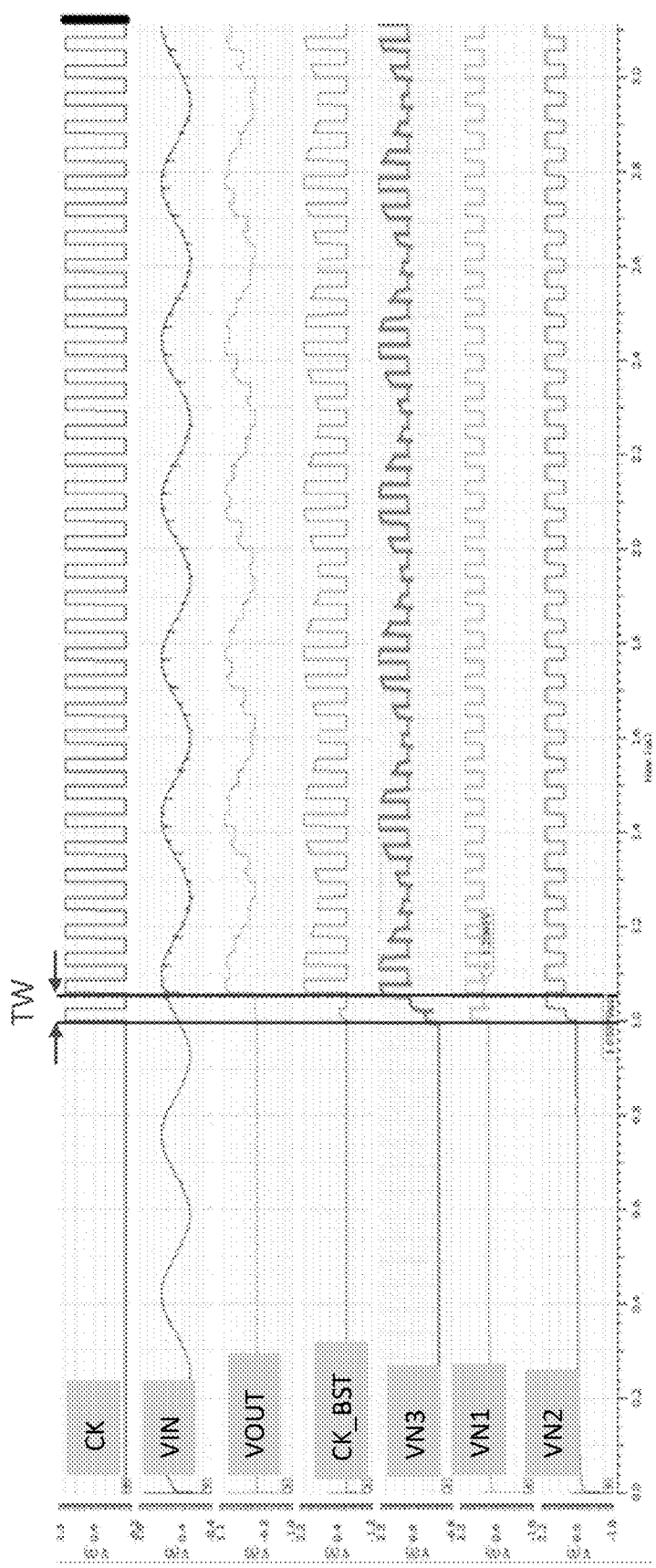
FIG. 8 shows a simulation waveform diagram of an embodiment of a track-and-hold circuit according to the present invention.
Figure 9:
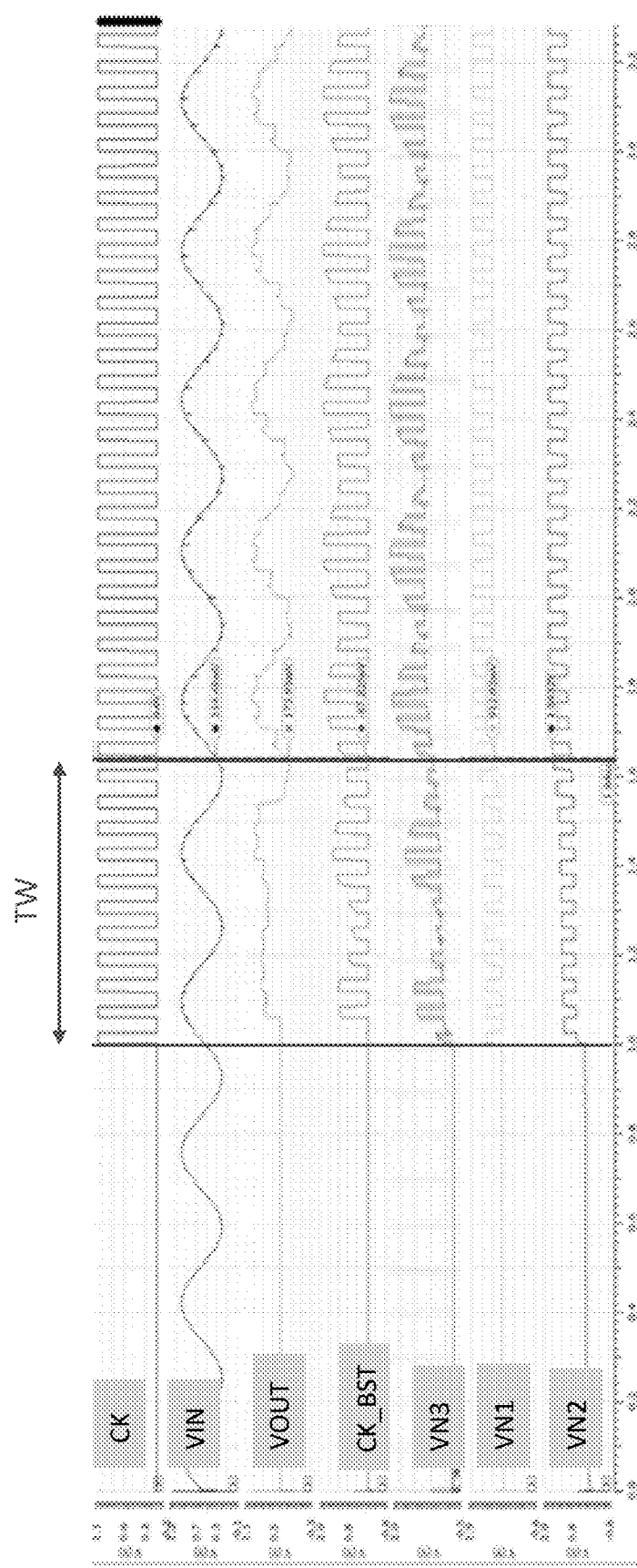
FIG. 9 shows a simulation waveform diagram of an embodiment of a track-and-hold circuit according to the present invention.

FIG. 8 and FIG. 9 show simulation waveform diagrams of embodiments, corresponding to typical and worst-case process corners respectively, of a track-and-hold circuit according to the present invention.

Displayed in FIG. 8 and FIG. 9 are the clock signal CK, the input signal VIN, the bootstrapped driving signal CK_BST, the voltages VN1-VN3 on nodes N1-N3 respectively. The simulation shows that the wake-up delay time TW can be reduced as short as around 0.1 us (FIG. 8) in typical process corner and around 1.0 us in the worst-case process corner (slow-slow/1.08/−40° C., FIG. 9). Compared to the aforementioned prior art, an improvement of nearly three orders of magnitude is achieved by the proposed track-and-hold circuit according to the present invention.

Still referring to FIG. 8 and FIG. 9, from one perspective, the bootstrapped driving signal CK_BST is in synchronous with the clock signal CK, while bootstrapped by the input signal VIN and related clock signals (such as CKBD, CKB and CK1), such that the gate-source voltage of the bootstrapped switch M15 can be relatively constant when being turned on.

It is noteworthy that the employment of the pre-charging circuit of the present invention enables the track-and-hold circuit to utilize MOSFET capacitors as pumping capacitors, which reduces the chip layout area and the fabrication cost. In one embodiment, the MOSFET cap (MC1, MC2 or MC3) is implemented by a same type MOSFET device, formed in same process steps, of at least one switch (e.g., M1, M2 or M3) within the charge pump circuit 310. In one embodiment, the MOSFET cap is implemented by a PMOSFET in the CMOS process for implementing other CMOS devices building the track-and-hold circuit.

In one embodiment, the pre-charging circuit 320 pre-charges the body of the MOSFET cap during the startup (or wake-up back from a long sleep state) of the charge pump circuit 310, and can be disabled when the pumped voltage is high enough or when a predetermined startup time has expired.

Figure 10:
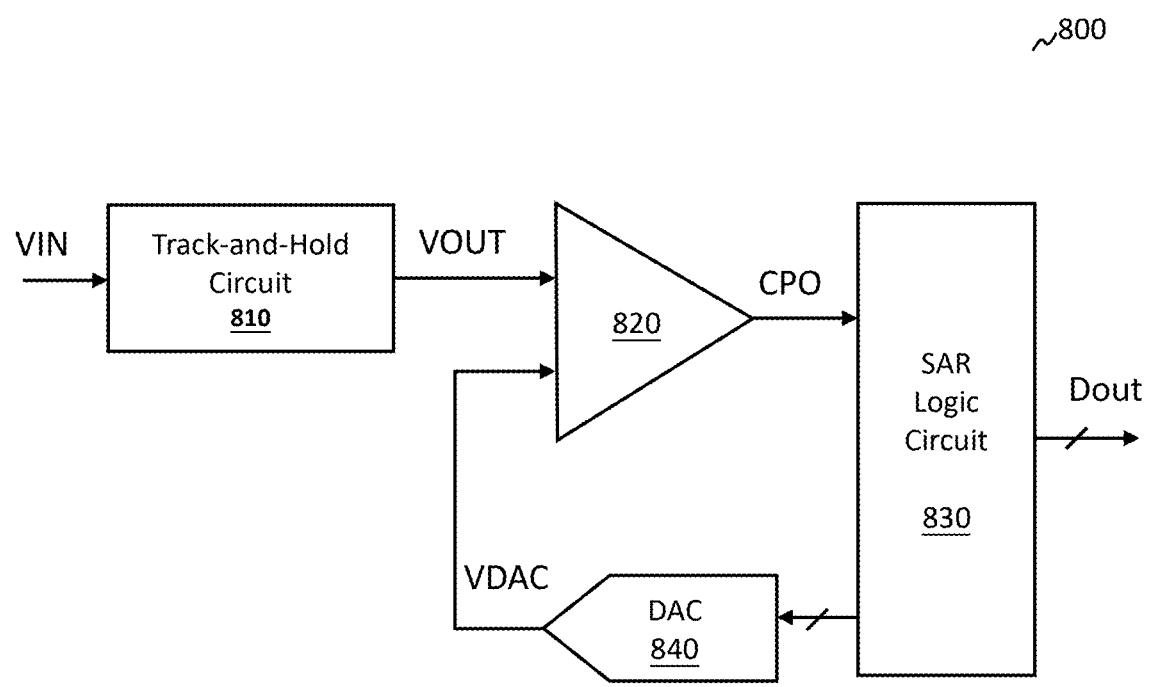
FIG. 10 shows a block diagram of an embodiment of a SAR ADC utilizing a track-and-hold circuit according to the present invention.

FIG. 10 shows a block diagram of an embodiment of a SAR ADC utilizing a track-and-hold circuit according to the present invention. In this embodiment, the SAR ADC 800 includes a track-and-hold circuit 810, a comparator 820, a SAR logic circuit 830 and a digital-to-analog converter (DAC) 840. The track-and-hold circuit 810 for example correspond to the embodiment of FIG. 3. The track-and-hold circuit 810 tracks and holds the input signal VIN to generate a track-and-hold output signal VOUT. The comparator 820, the SAR logic circuit 830 and the DAC 840 are configured to convert the track-and-hold output signal VOUT by successive approximation register conversion to generate a corresponding digital code Dout, which is known in the art and not elaborated in detail here.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A track-and-hold circuit comprising:
   a charge pump circuit configured to pump a supply voltage into a pumped voltage which is higher than the supply voltage, including:
      at least one metal-oxide-semiconductor field-effect transistor (MOSFET) capacitor (MOSFET cap), switched based on a clock signal; and
      a pre-charging circuit, configured to pre-charge a body of the at least one MOSFET cap based on a pre-charging signal synchronous with the clock signal, thereby reducing a wake-up delay time of the pumped voltage; and
   a bootstrapped switch, configured to track and hold an input signal received from one end of the bootstrapped switch based on a bootstrapped driving signal, thereby generating a track-and-hold output signal on another end of the bootstrapped switch;
   wherein the bootstrapped driving signal is generated based on a track-and-hold control signal related to the clock signal, the input signal and the pumped voltage provided by the charge pump circuit.

2. The track-and-hold circuit of claim 1, wherein the pre-charging circuit includes:
   a pre-charging switch, coupled between a pull-up source and the body of the at least one MOSFET cap, wherein the pre-charging switch is switched based on the clock signal to generate the pre-charging signal which pulls up a body bias voltage of the body of the at least one MOSFET cap to the pull-up source.

3. The track-and-hold circuit of claim 2, wherein the supply voltage serves as the pull-up source.

4. The track-and-hold circuit of claim 2, wherein the pre-charging switch is controlled to switch in synchronization with a specific phase, of the clock signal, during which a baseline voltage of the voltage across the at least one MOSFET cap is to be is to be pull-down to logic low by the clock signal for charging the at least one MOSFET cap.

5. The track-and-hold circuit of claim 2, wherein the pre-charging circuit further comprises:
   a clamping transistor, coupled between the body of the at least one MOSFET capacitor and the pre-charging switch, configured to protect the pre-charging switch from high voltage stress originating from the body of the at least one MOSFET capacitor;
   wherein the clamping transistor is configured as a source follower, biased by a predetermined voltage to clamp a voltage of the pre-charging switch not exceeding a predetermined upper limit.

6. The track-and-hold circuit of claim 1, wherein the charge pump circuit is configured as a voltage doubler, wherein the at least one MOSFET cap includes a first and a second MOSFET capacitors, each configured to store charge and to be pumped to a higher voltage related to the pumped voltage, wherein the charge pump circuit further includes:
   a first switch and a second switch which are cross-coupled, wherein the first and the second switches are coupled to the first and second MOSFET capacitors respectively at respective source terminal thereof, and gates the first and the second switches are cross-coupled to the second and the first MOSFET capacitors respectively;
   wherein the first MOSFET capacitor is switched by the clock signal and the second MOSFET capacitor is switched by an inverse of the clock signal, facilitating alternate charging and pumping cycles between the first and second MOSFET capacitors;
   wherein the pre-charging circuit is configured to pre-charge at least one of the first and second MOSFET capacitors.

7. The track-and-hold circuit of claim 6, further comprising a third switch and a third MOSFET capacitor which are coupled to the second capacitor and are configured to generate and holding the pumped voltage, wherein the pre-charging circuit is configured to pre-charge the first MOSFET capacitor, thereby balancing the capacitive loading between the first and the second MOSFET capacitors while providing the pumped voltage.

8. The track-and-hold circuit of claim 1, wherein the MOSFET cap is implemented by a same type MOSFET device, formed in same process steps, of at least one switch within the charge pump circuit.

9. The track-and-hold circuit of claim 1, wherein the pre-charging circuit pre-charges the body of the MOSFET cap during startup of the charge pump circuit, and is disabled when the pumped voltage is high enough or when a predetermined startup time has expired.

10. The track-and-hold circuit of claim 1, for use in a successive approximation register analog-to-digital converter (SAR ADC), wherein the SAR ADC includes a comparator, a SAR logic circuit and a digital-to-analog converter (DAC), wherein the track-and-hold circuit is configured to track and hold the input signal to generate the track-and-hold output signal, wherein the comparator, the SAR logic circuit and the DAC are configured to convert the track-and-hold output signal by successive approximation register conversion to generate a corresponding digital code.

* * * * *